(12) United States Patent
Edeler

(10) Patent No.: US 8,918,150 B2
(45) Date of Patent: *Dec. 23, 2014

(54) ELECTROMAGNETIC SHIELDING AND AN ACOUSTIC CHAMBER FOR A MICROPHONE IN A MOBILE ELECTRONIC DEVICE

(71) Applicant: BlackBerry Limited, Waterloo (CA)

(72) Inventor: Wolfgang Edeler, Vreden (DE)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/693,153

(22) Filed: Dec. 4, 2012

(65) Prior Publication Data

US 2013/0095897 A1 Apr. 18, 2013
US 2013/0237293 A2 Sep. 12, 2013

Related U.S. Application Data

(63) Continuation of application No. 12/852,232, filed on Aug. 6, 2010, now Pat. No. 8,340,735.

(51) Int. Cl.
*H04M 1/00* (2006.01)
*H04M 1/02* (2006.01)
*H05K 9/00* (2006.01)
*H04M 1/03* (2006.01)

(52) U.S. Cl.
CPC .............. *H04M 1/026* (2013.01); *H05K 9/002* (2013.01); *H04M 1/035* (2013.01)
USPC .................. 455/575.5; 455/575.1; 455/575.7; 455/575.8; 455/550.1

(58) Field of Classification Search
CPC ....... H04M 1/026; H04M 1/035; H05K 9/002
USPC ..................... 455/550.1, 556.2, 575.1–575.8, 455/90.1–90.3; 381/355, 174, 386; 379/419
See application file for complete search history.

(56) References Cited

U.S. PATENT DOCUMENTS 7,089,646 B2 * 8/2006 Leerkamp et al. ............ 29/592.1
7,353,041 B2 * 4/2008 Zhu et al. .................... 455/550.1

(Continued)

FOREIGN PATENT DOCUMENTS

CN 1917382 2/2007
CN 101677423 3/2010

(Continued)

OTHER PUBLICATIONS

Office Action mailed Jul. 12, 2012, in corresponding Republic of Korea patent application No. 10-2011-0078280.

(Continued)

*Primary Examiner* — Babar Sarwar
(74) *Attorney, Agent, or Firm* — Novak Druce Connolly Bove + Quigg LLP

(57) ABSTRACT

A circuit board in a mobile electronic device has a microphone and related amplifier and signal conditioning circuitry mounted thereon. A radio frequency (RF) shield surrounds and isolates the microphone from electromagnetic interference (EMI). The RF shield together with the circuit board forms an acoustic chamber surrounding the microphone. A hole in the RF shield permits acoustic energy to enter the acoustic chamber and reach the microphone.

25 Claims, 10 Drawing Sheets

(56) References Cited

U.S. PATENT DOCUMENTS

| | | | |
|---|---|---|---|
| 7,398,072 B2 * | 7/2008 | Corrigan et al. | 455/301 |
| 8,126,166 B2 * | 2/2012 | Song | 381/174 |
| 2006/0104469 A1 * | 5/2006 | Hawker et al. | 381/365 |
| 2006/0293091 A1 | 12/2006 | Hawker et al. | |
| 2007/0116261 A1 * | 5/2007 | Hawker et al. | 379/419 |
| 2010/0061584 A1 * | 3/2010 | Lin et al. | 381/386 |
| 2010/0119087 A1 | 5/2010 | Kimura | |
| 2011/0116661 A1 | 5/2011 | Makihata et al. | |
| 2011/0233692 A1 | 9/2011 | Inoda et al. | |

FOREIGN PATENT DOCUMENTS

| | | |
|---|---|---|
| EP | 1657955 | 5/2006 |
| EP | 1739933 | 1/2007 |
| EP | 1780989 | 5/2007 |
| EP | 1833284 | 9/2007 |
| EP | 1860929 | 11/2007 |
| EP | 1901579 | 3/2008 |
| EP | 1924060 | 5/2008 |
| EP | 1983727 | 10/2008 |
| EP | 2114084 | 11/2009 |
| JP | 10271195 | 10/1998 |
| JP | 200713966 | 1/2007 |
| JP | 2007129787 | 5/2007 |
| JP | 2008072580 | 3/2008 |
| JP | 2008199353 A | 8/2008 |
| JP | 2008-245111 | 10/2008 |
| JP | 200944600 | 2/2009 |
| JP | 2009212844 | 9/2009 |
| JP | 2009232164 | 10/2009 |
| JP | 2009247007 | 10/2009 |
| JP | 2010041565 | 2/2010 |
| JP | 2010104006 | 5/2010 |
| JP | 2010035070 | 12/2010 |
| WO | 2007129788 | 11/2007 |
| WO | 2008050583 | 5/2008 |
| WO | 2010067834 | 6/2010 |

OTHER PUBLICATIONS

English translation of the Office Action mailed May 21, 2012, for corresponding Japanese application No. 2011-172125.
EP2357844, English-language equivalent of WO 2010-067834, which is cited in the Japanese Office Action as Reference 1.
English abstract of JP2009-232164, which is cited in the Japanese Office Action as Reference 2.
Extended European Search report mailed Jan. 24, 2011, in corresponding European patent application No. 10172125.6.
Second Examination Report mailed May 23, 2011, in corresponding European patent application No. 10172125.6.
Office Action mailed Sep. 3, 2013, in corresponding Canadian patent application No. 2,747,010.
English translation of the Office Action mailed May 10, 2013, in corresponding Japanese patent application No. 2012-181512.
English translation of the the First office Action mailed Sep. 5, 2013, in corresponding Chinese patent application No. 201110223507.X.
English abstract for CN1917382; published on Feb. 21, 2007 and retrieved on Oct. 17, 2013.
English abstract for CN101677423; published on Mar. 24, 2010 and retrieved on Oct. 17, 2013.
English abstract for JP2007129787; published on May 24, 2007 and retrieved on Oct. 17, 2013.
English abstract for JP2008199353; published on Aug. 28, 2008 and retrieved on Oct. 17, 2013.
English abstract for JP2010035070; published on Feb. 12, 2010 and retrieved on May 10, 2013.
Examination Report mailed Feb. 14, 2014; in corresponding European patent application No. 10172125.6.
English abstract for JP2008-245111; published on Oct. 9, 2008 and retrieved on Dec. 3, 2013.
English abstract for JP10-271195; published on Oct. 9, 1998 and retrieved on Dec. 3, 2013.
English abstract for JP2009247007; published on Oct. 22, 2009 and retrieved on May 2, 2014.
English translation of the Notice of rejection mailed Dec. 3, 2013; in corresponding Japanese patent application No. 2013-005563.
English abstract for JP2008072580; published on Mar. 27, 2008 and retrieved on May 2, 2014.
English abstract for JP2010104006; published on May 6, 2010 and retrieved on May 2, 2014.
English abstract for JP2010041565; published on Feb. 18, 2010 and retrieved on May 2, 2014.
English abstract for JP2009212844; published on Sep. 17, 2009 and retrieved on May 2, 2014.

* cited by examiner

ELECTROMAGNETIC SHIELDING AND AN ACOUSTIC CHAMBER FOR A MICROPHONE IN A MOBILE ELECTRONIC DEVICE

CROSS-REFERENCE TO RELATED APPLICATIONS

This application is a continuation application of U.S. patent application Ser. No. 12/852,232 filed on Aug. 6, 2010, said application is expressly incorporated by reference herein in its entirety.

TECHNICAL FIELD

The disclosure is related to the field of mobile electronic devices, and more particularly is related to electromagnetic shielding and audio performance of an audio system and methods related thereto.

BACKGROUND

Currently, the popularity of mobile communication devices such as cellular telephones, including smartphones and so called superphones, continues to increase as more and more people around the world adopt them for both personal and business communications. Such mobile communication devices enable users to place and receive phone calls almost anywhere they travel. As the technology incorporated within mobile communication devices advances, so too has the functionality of these devices. Many mobile communication devices provide numerous advanced features in addition to the basic telephone calling ability. Such features include for example, wireless Internet browsing via a cellular data network (e.g., 3G, 4G) or available wireless local area network (WLAN) hotspot, wireless email, calendaring, address book, task lists, calculators, word processing, spreadsheets, etc. In addition, the more advanced mobile communication devices have the capability of running applications (referred to as 'apps') that provide specific functionality to the device. Such applications (typically free or low cost) are downloaded from the Internet and installed on the device.

The increase in the functionality of mobile communication devices is also driving the demand for smaller and smaller devices that are easier and more convenient for users to carry. This is putting pressure on mobile communication device designers to shrink the physical size of internal circuit boards and electrical/electronic components within the device. This causes many components to be located closer together, especially the radio frequency (RF) components such as the antenna, microphone components, RF power amplifiers, etc. This increases the possibility that the various electronic components in the device will suffer from electromagnetic interference (EMI) either from RF components and subsystems in the device and/or from external sources. For example, an internal surface mounted microphone could pick up conducted energy directly from an RF power amplifier or from the energy radiated by the antenna. This unwanted reception of conducted/near field radiated energy from power amplifiers and antennae may be particularly problematic in burst transmission schemes such as a Global System for Mobile communications (GSM) system.

Sources of other interfering EMI signals in some mobile wireless communications devices include the liquid crystal display (LCD), microprocessor or central processing unit (CPU), clock generator circuits, etc. which radiate RF energy, possibly interfering with unshielded components thereby degrading device performance Additional problems may occur when the conducted and radiated interfering RF energy is coupled to the mobile communications device causing audio break through tests to fail for both the uplink and downlink Even keyboard circuits can potentially create unwanted EMI problems. For example, RF receiver sensitivity is often degraded by the EMI of spectral harmonics emitted from the microprocessor or CPU via the keyboard because of the resulting loop formed by any keyboard circuits. In some instances, strong RF energy, for example, the transmitted power from the radio via the antenna interferes with or couples to the microprocessor or CPU input/output (I/O) lines of the mobile communications device through the keyboard Key-In and Key-Out lines and causes a reset of the microprocessor or CPU.

BRIEF DESCRIPTION OF THE DRAWINGS

The mechanism is herein described, by way of example only, with reference to the accompanying drawings, wherein.

DETAILED DESCRIPTION

Notation Used Throughout

Figure 1:
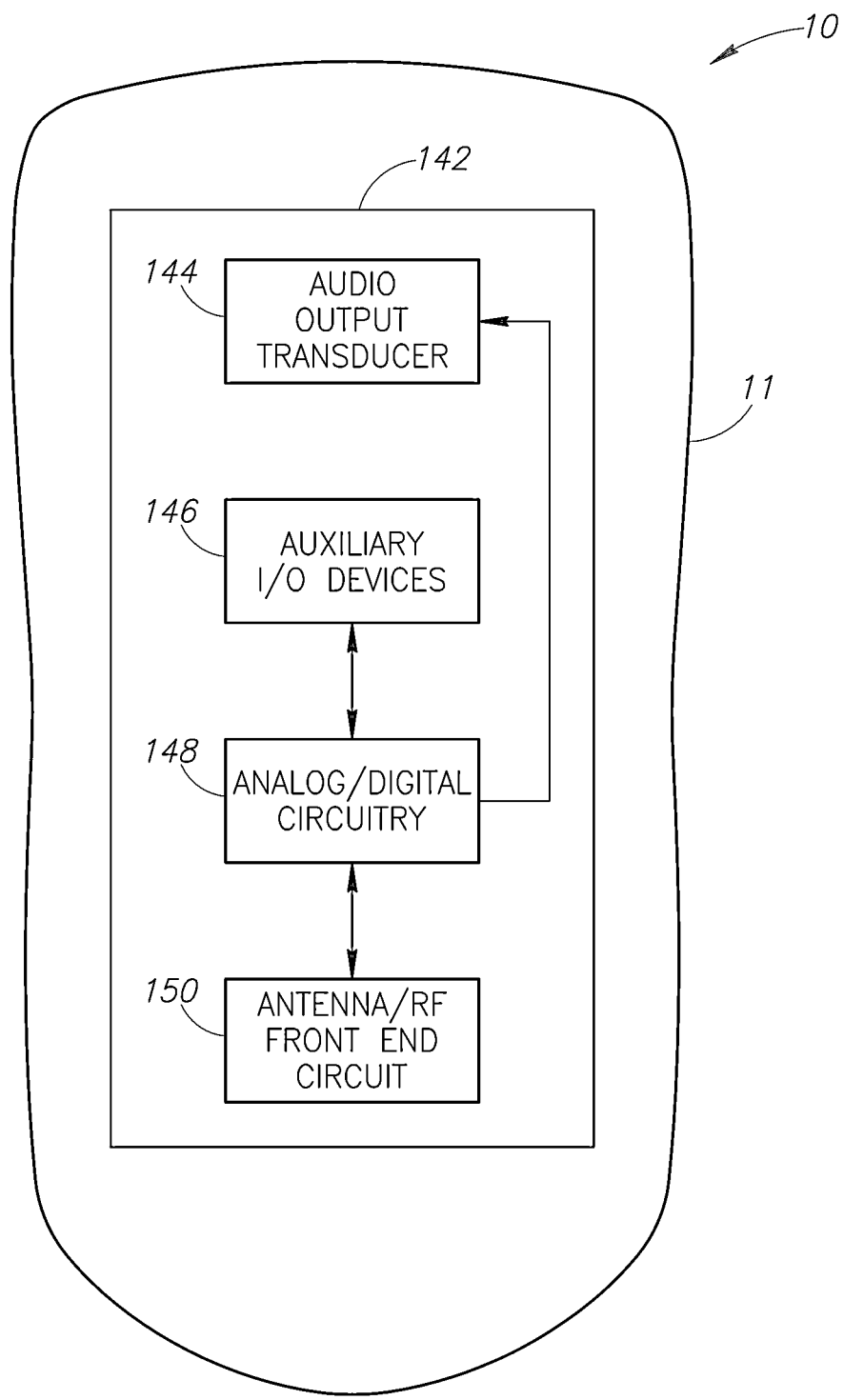
FIG. 1 is a simplified block diagram illustrating several component blocks of an example handheld wireless mobile communications device incorporating the electromagnetically shielded audio system.

The following notation is used throughout this document:

| Term | Definition |
|---|---|
| CDMA | Code Division Multiple Access |
| CPU | Central Processing Unit |
| DC | Direct Current |
| DSP | Digital Signal Processor |
| EDGE | Enhanced Data rates for GSM Evolution |
| EMC | Electromagnetic Compatibility |
| EMI | Electromagnetic Interference |
| FM | Frequency Modulation |
| FPGA | Field Programmable Gate Array |
| GPRS | General Packet Radio Service |
| GPS | Global Positioning System |
| GSM | Global System for Mobile communications |
| IC | Integrated Circuit |
| LAN | Local Area Network |
| LCD | Liquid Crystal Display |
| MAC | Media Access Control |
| PC | Personal Computer |
| PCB | Printed Circuit Board |
| PCI | Peripheral Component Interconnect |
| PCS | Personal Communication Services |
| PDA | Personal Digital Assistant |
| PNA | Personal Navigation Assistant |
| RAM | Random Access Memory |
| RAT | Radio Access Technology |
| RF | Radio Frequency |
| RFI | Radio Frequency Interference |
| ROM | Read Only Memory |
| RSSI | Received Signal Strength Indicator |
| RUIM | Re-Usable Identification Module |
| SDIO | Secure Digital Input/Output |
| SIM | Subscriber Identity Module |
| SPI | Serial peripheral interconnect |
| USB | Universal Serial Bus |
| WCDMA | Wideband Code Division Multiple Access |
| WLAN | Wireless Local Area Network |

DETAILED DESCRIPTION

The present disclosure will now be presented more fully hereinafter with reference to the accompanying drawings, in which preferred embodiments of the disclosure are shown. The claimed invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

The disclosure is directed to providing electromagnetic shielding and an acoustic chamber for a microphone and optionally for components that are electrically connected to the microphone. The acoustic chamber may influence audio performance of the microphone and therefore of the audio system in which the microphone is comprised. For example, the acoustic chamber may affect frequency response, voice intelligibility, background noise rejection, efficiency, signal to noise ratio and sound quality of the audio system.

As described above, there may be concerns created when an internal microphone, for example, a surface-mounted technology (SMT) microphone, is subjected to EMI from internal or external sources (e.g., power amplifier, RF subsystem, antenna, digital circuitry, clock circuits, etc.). Concerns related to EMI may be overcome with the electromagnetic shielded audio system. The use of an appropriate RF shielding and EMC filters—in one non-limiting example—reduces audio degradation. In an example embodiment, a radio frequency (RF) shield surrounds the internal microphone and its associated circuitry to reduce or eliminate EMI related problems with operation of the microphone. The RF shield may also provide adequate isolation from the radiated RF energy emitted by the antenna during radio transmissions. That is, the RF shield may substantially prevent RF energy emitted by the antenna from interacting and/or interfering with the shielded system.

Figure 2:
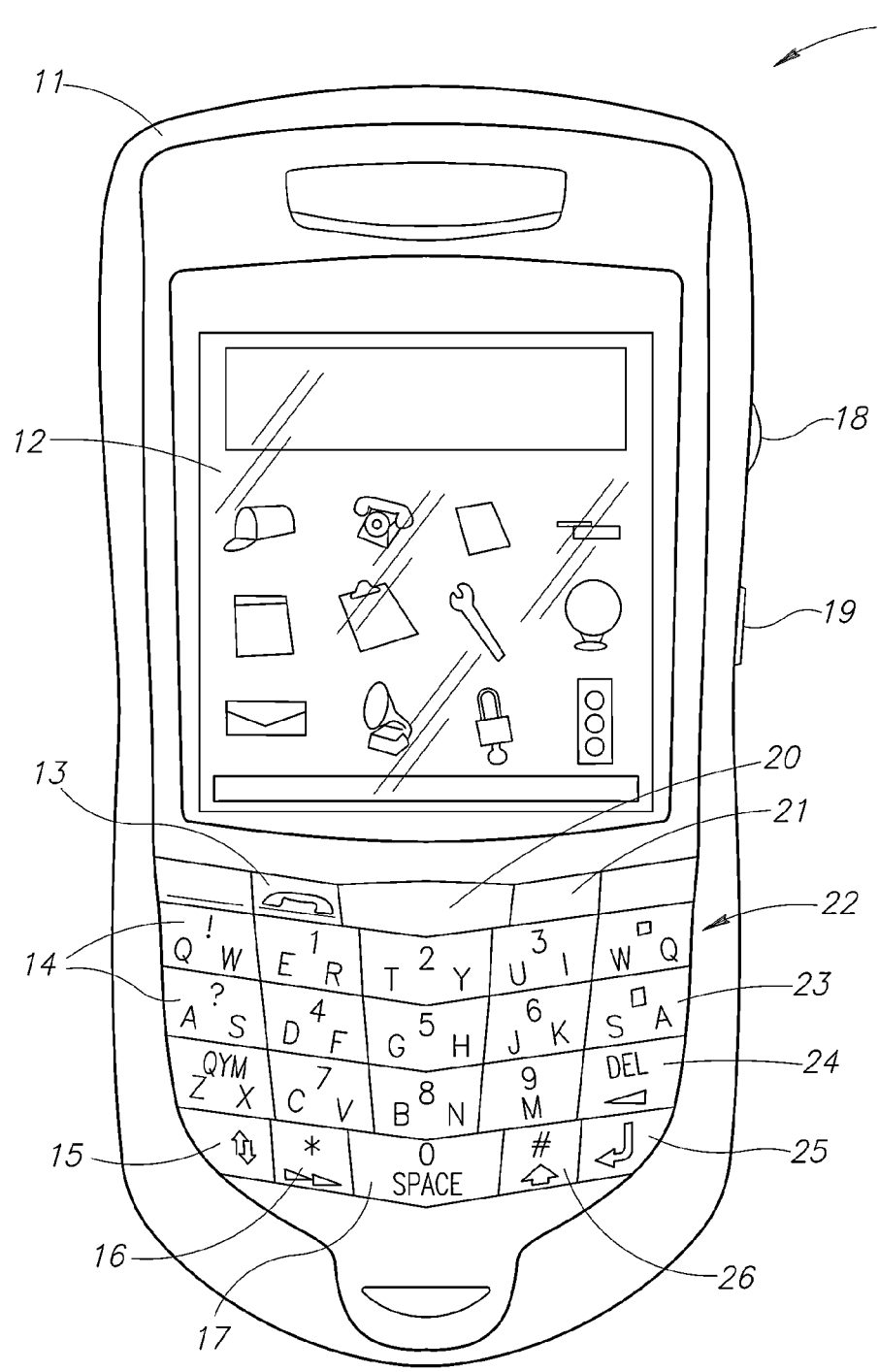
FIG. 2 is a diagram illustrating the component features of an example handheld wireless mobile communications device incorporating the electromagnetically shielded audio system.
Figure 3:
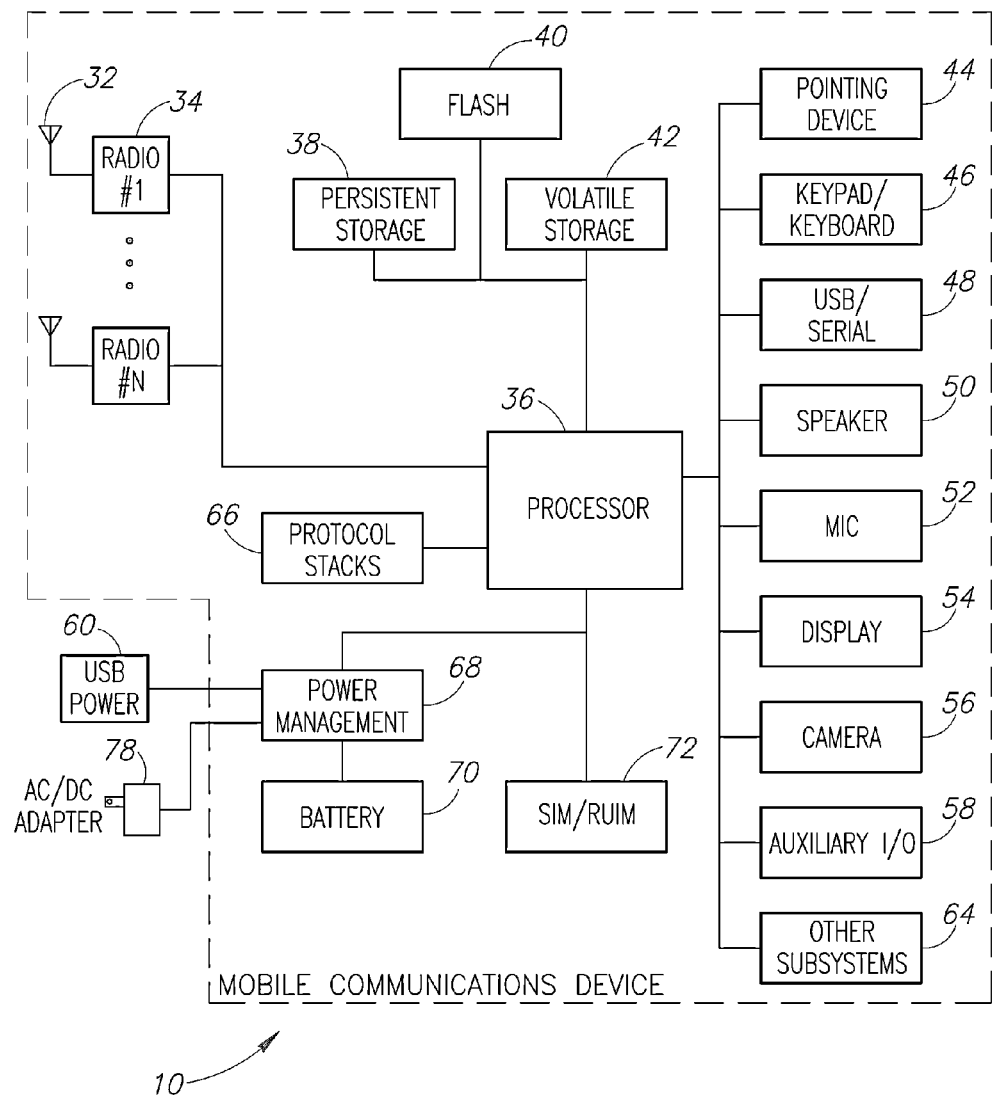
FIG. 3 is a block diagram illustrating the functional blocks of an example handheld wireless mobile communications device incorporating the electromagnetically shielded audio system.

Concerns associated with electromagnetic interference (EMI) in the audio circuit portion of a communications device such as shown in FIGS. 1, 2 and 3 may be addressed by reducing the conducted and radiated interfering RF energy that is coupled to the mobile wireless communications device, which otherwise could create audible noise and cause RF immunity failure in both the uplink and downlink communications. An RF shield encloses an EMI filter and microphone to reduce or eliminate the conducted interfering RF energy from the coupling to the audio circuits via external or internal RF noise sources.

A block diagram illustrating the component features of an example handheld wireless mobile communications device incorporating the electromagnetically shielded audio system is shown in FIG. 1. A diagram illustrating the component features of an example handheld wireless mobile communications device incorporating the electromagnetically shielded audio system is shown in FIG. 2.

With reference to FIGS. 1 and 2, the mobile wireless communications device (e.g., handheld cellular telephone), generally referenced 10, is presented for illustration purposes only and is a representative non-limiting example. It is appreciated that the electromagnetically shielded audio system may be incorporated in numerous other types of electronic devices without departing from the scope therefrom.

The device 10 comprises a housing 11 and circuit board 142, such as a conventional printed circuit board (PCB) substrate, for example, secured inside the housing. Note that the term "circuit board" as used herein refers to any dielectric substrate, PCB, ceramic substrate or other circuit carrying structure for carrying signal circuits and electronic components within the mobile wireless communications device 10. Further, the term circuit board, although used in the singular, may also refer to a plurality of circuit boards. In this example, the housing 11 comprises a static housing, for example, as opposed to a flip or sliding housing which are used in many cellular telephones. These and other housing configurations, however, may also be used.

Analog and digital circuitry 148, mounted on circuit board 142, may comprise a microprocessor, memory, one or more broadband and/or baseband transceivers (e.g., cellular, WLAN, GPS, Bluetooth, WiMAX, UWB, etc.) including RF circuitry, power amplifier circuits, etc., keyboard circuitry, etc. It is noted that the keyboard circuitry may be mounted on a separate keyboard subsystem or circuit board, etc., as will be appreciated by those skilled in the art. A battery or other power supply (not shown) is also preferably secured by housing 11 for supplying power to circuitry 148. Circuitry 148 may also comprise audio circuitry, which includes a microphone and related microphone signal conditioning and amplification circuitry.

The general term "RF circuitry" is intended to encompass not only communication circuitry but also any other circuitry and/or interconnection that produces electromagnetic emission. For example, processors may operate and frequencies in the range of hundreds Megahertz to several Gigahertz and may produce electromagnetic emission at that range of frequencies. A PCB inside the device may carry signals, for example between a processor and a memory device, in that frequency range as well. In another example, display circuitry may also produce electromagnetic emission at that range of frequencies. Therefore, the term "RF circuitry" encompasses any component, circuitry and interconnection between components that may produce electromagnetic emission. Accordingly, any of the components and circuitry described herein in relation to FIGS. 1, 2 and 3 and any of the interconnections (conductive traces) between such components may be considered "RF circuitry".

The device 10 may also comprise an audio output transducer 144 (e.g., a speaker) secured in the housing 11 and connected to circuitry 148. One or more user input interface devices, such as a keypad (keyboard) 22, is also preferably secured in the housing 11 and connected to circuitry 148. The term keypad as used herein also refers to the term keyboard, indicating the user input devices having lettered and/or numbered keys commonly known and other embodiments, including multi-top or predictive entry modes. Other examples of user input interface devices include a scroll wheel 18 and a back button 19. It is appreciated that other user input interface devices (e.g., a stylus or touch screen interface) may be used in other embodiments.

An antenna/RF front end circuit 150 may be positioned in the lower portion of the housing and can be formed as a pattern of conductive traces that make an antenna circuit, which physically forms the antenna. RF front end circuitry may optionally be implemented in the antenna block 150 or in the circuit block 148. The RF output signal is input to the circuitry block 148 for further processing.

The device 10 also comprises a plurality of auxiliary I/O devices 146. Examples of auxiliary I/O devices include a WLAN subsystem, Bluetooth subsystem, camera subsystem for providing digital camera capabilities, GPS subsystem, flash memory card subsystem, a second audio output transducer (e.g., a speaker for speaker phone operation), and a camera lens for providing digital camera capabilities, an electrical device connector, e.g., USB, headphone, secure digital (SD) or memory card, etc.

The device 10 also comprises a display 12, for example, a liquid crystal display (LCD) secured in the housing 11 and connected to circuitry 148. A back button 19 and scroll wheel 18 can also be connected to circuitry 148 for allowing a user to navigate menus, text, etc., as will be appreciated by those skilled in the art. The scroll wheel 18 may also be referred to as a "thumb wheel" or a "track wheel". In addition to or in the alternative to the scroll wheel 18, the device 10 may include a user interface apparatus such as a trackball or an optical trackpad (not shown in FIG. 2). The keypad 22 comprises a plurality of multi-symbol keys 14 each having indicia of a plurality of respective symbols thereon. The keypad 22 also comprises an alternate function key 15, a next key 16, a space key 17, a shift key 26, a return (or enter) key 25, a backspace/delete key 24, a send key 13, an end key 21, and a convenience (e.g., menu) key 20 for use in placing cellular telephone calls, as will be appreciated by those skilled in the art.

The mobile wireless communications device 10 as described herein may advantageously be used not only as a traditional cellular phone, but may also be used for sending and/or receiving data over a cellular data (3G, 4G, etc.) or other network, such as Internet and email data, for example. Of course, other keypad configurations may also be used in other embodiments. Multi-tap or predictive entry modes may be used for typing e-mails, etc. as will be appreciated by those skilled in the art.

A block diagram illustrating the functional blocks of an example handheld wireless mobile communications device incorporating the electromagnetically shielded audio system is shown in FIG. 3. The mobile communication device is preferably a two-way communication device having voice and data communication capabilities. In addition, the device optionally has the capability to communicate with other computer systems via the Internet. Note that the mobile communications device (or mobile device) may comprise any suitable wired or wireless device such as multimedia player, mobile communication device, cellular phone, smartphone, PDA, PNA, Bluetooth device, etc. For illustration purposes only, the device is shown as a mobile device, such as a cellular based smartphone or so called superphone. Note that this example is not intended to limit the scope of the mechanism as the object selection mechanism can be implemented in a wide variety of communication devices. It is further appreciated the mobile device 10 shown is intentionally simplified to illustrate only certain components, as the mobile device may comprise other components and subsystems 64 beyond those shown.

The mobile device, generally referenced 10, comprises a processor 36 which may comprise a baseband processor, CPU, microprocessor, DSP, etc., optionally having both analog and digital portions. The mobile device may comprise a plurality of radios 34 and associated antennas 32. Radios for the basic cellular link and any number of other wireless standards and Radio Access Technologies (RATS) may be included. Examples include, but are not limited to, Code Division Multiple Access (CDMA), Personal Communication Services (PCS), Global System for Mobile Communication (GSM)/GPRS/EDGE 3G; WCDMA; WiMAX for providing WiMAX wireless connectivity when within the range of a WiMAX wireless network; Bluetooth for providing Bluetooth wireless connectivity when within the range of a Bluetooth wireless network; WLAN for providing wireless connectivity when in a hot spot or within the range of an ad hoc, infrastructure or mesh based wireless LAN (WLAN) network; near field communications; UWB; GPS receiver for receiving GPS radio signals transmitted from one or more orbiting GPS satellites, FM transceiver provides the user the ability to listen to FM broadcasts as well as the ability to transmit audio over an unused FM station at low power, such as for playback over a car or home stereo system having an FM receiver, digital broadcast television, etc. The mobile device also comprises protocol stacks 66, which may or may not be entirely or partially implemented in the processor 36. The protocol stacks implemented will depend on the particular wireless protocols required.

The mobile device may also comprise internal volatile storage 42 (e.g., RAM) and persistence storage 38 (e.g., ROM) and flash memory 40. Persistent storage 38 also stores applications executable by processor 36 including the related data files used by those applications to allow device 10 to perform its intended functions. Several user-interface devices include trackball/touchpad/thumbwheel 44 which may comprise a depressible or otherwise operable thumbwheel/touchpad/trackball that is used for navigation, selection of menu choices and confirmation of action, keypad/keyboard 46 such as arranged in QWERTY fashion for entering alphanumeric data and a numeric keypad for entering dialing digits and for other controls and inputs (the keyboard may also contain symbol, function and command keys such as a phone send/end key, a menu key and an escape key), microphone(s) 52, speaker(s) 50 and associated audio codec or other multimedia codecs, vibrator (not shown) for alerting a user, camera and related circuitry 56, display(s) 54 and associated display controller. A serial/USB or other interface connection 48 (e.g., SPI, SDIO, PCI, USD, etc.) provides a serial link to a user's PC or other device. SIM/RUIM card 72 provides the interface to a user's SIM or RUIM card for storing user data such as address book entries, user identification, etc.

Portable power is provided by a power pack such as the battery 70 coupled to power management circuitry 68. External power is provided via USB power 60 or an AC/DC adapter 78 connected to the power management circuitry 68 which is operative to manage the charging and discharging of the battery 70.

Operating system software executed by the processor 36 is preferably stored in persistent storage 38, or flash memory 40, but may be stored in other types of memory devices, such as a read only memory (ROM) or similar storage element. In addition, system software, specific device applications, or parts thereof, may be temporarily loaded into volatile storage 42, such as random access memory (RAM). Communications signals received by the mobile device may also be stored in the RAM.

The processor 36, in addition to its operating system functions, enables execution of software applications on the device 10. A predetermined set of applications that control basic device operations, such as data and voice communications, may be installed during manufacture. Additional applications (or apps) may be downloaded from the Internet and installed in memory for execution on processor 36.

When required network registration or activation procedures have been completed, the mobile device 10 may send and receive communications signals over a communications network (not shown). Signals received from the communications network by antenna 32 are processed by radio circuit 34. Processing includes, for example, signal amplification, frequency down conversion, filtering, channel selection, etc., and may also provide analog to digital conversion, synchronization, decoding, decryption, etc. Analog-to-digital conversion of the received signal allows more complex communications functions, such as demodulation and decoding to be performed. Signals to be transmitted are processed and transmitted by the radio circuit 34, including digital to analog conversion, frequency up conversion, filtering, amplification and transmission to the communication network via antenna 32.

Figure 4:
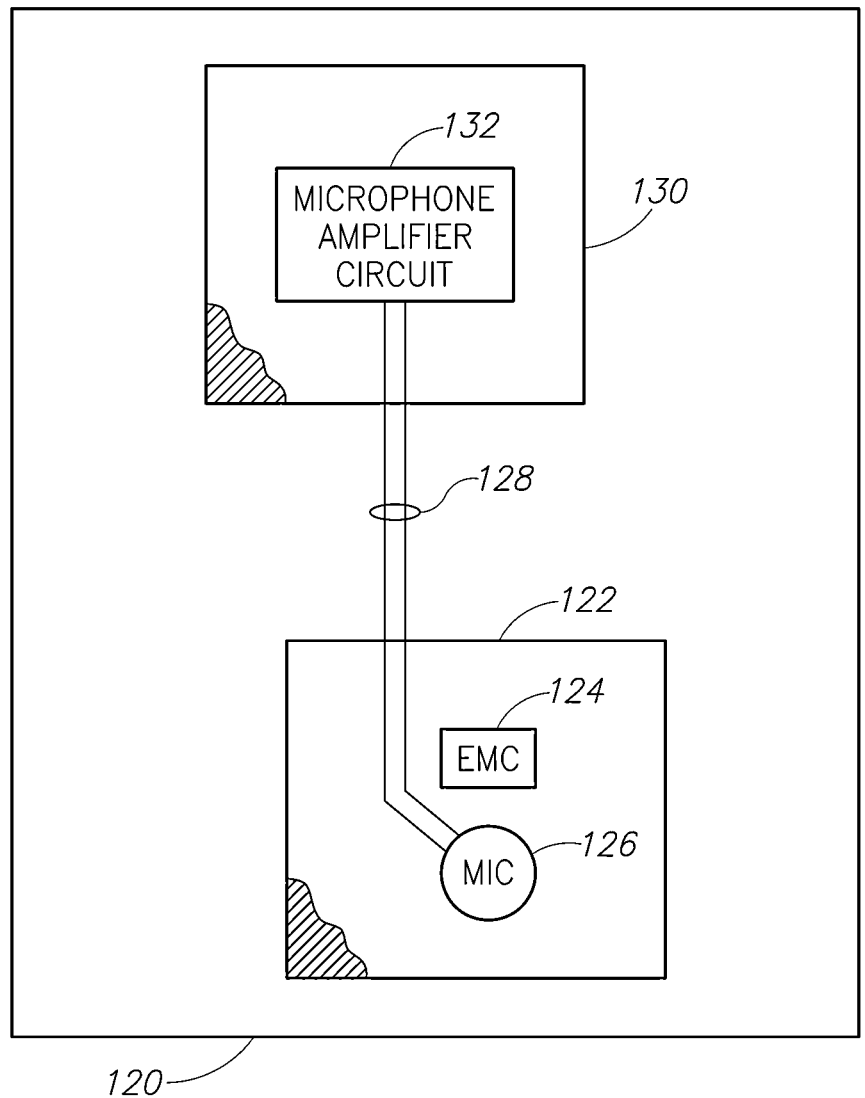
FIG. 4 is an elevational view of a section of an example circuit board incorporating the electromagnetically shielded audio system.

An elevational view of a section of an example circuit board incorporating the electromagnetically shielded audio system is shown in FIG. 4. The example circuit board layout comprises a portion of the circuit board 120 that can be included within the mobile communications device 10 of FIGS. 1, 2 and 3. The circuit board layout comprises two portions: a first portion comprises a microphone (MIC) 126 (surface mounted or otherwise), EMC noise isolation circuit 124 and an RF shield 122; and a second portion comprises a microphone signal conditional and amplifier circuit 132 and an RF shield 130. Although shown for clarity in FIG. 4, microphone 126 and EMC noise isolation circuit 124 may be completely or partially obscured by RF shield 122 and amplifier circuit 132 may be completely or partially obscured by RF shield 130.

The microphone 126 and related amplifier circuitry are mounted on the circuit board 120 surrounded by RF isolation shields ("cans"), forming RF isolation compartments on the circuit board. A plurality of microphone signal lines 128 are routed from the microphone 126 to the amplifier circuit 132. Each RF shield 122, 130 is electrically conductive and may be constructed from various electrically conductive materials, such as metal, metalized plastic, etc. and may have any suitable shape or configuration, e.g., include sides and a top, round walls and a top, etc. The RF shields 122 and 130 may be solderable to circuit board 120.

The EMC components 124 comprise passive components such as capacitors, feed through capacitors, filters and/or inductors in either a balanced and/or unbalanced configuration. EMC components 124 may be used to reduce conducted electromagnetic interference to microphone 126

Amplifier circuit 132 comprises electrical components useful for conditioning and amplifying the signal received from microphone 126. This may include active components such as audio integrated circuits (ICs), audio power amplifiers, transistors and diodes, and passive components such as resistors, capacitors. Amplifier circuit 132 may also comprise passive components such as resistors, capacitors, filters and/or inductors.

The RF shield 122 is a metallic or metalized housing secured to the circuit board 120 and surrounding microphone 126, shielding microphone 126 and optionally EMC components 124 from electromagnetic interference. Similarly, RF shield 130 is a metallic or metalized housing secured to the circuit board 120 and surrounding amplifier circuitry 132, shielding amplifier circuitry 132 from electromagnetic interference.

Figure 5:
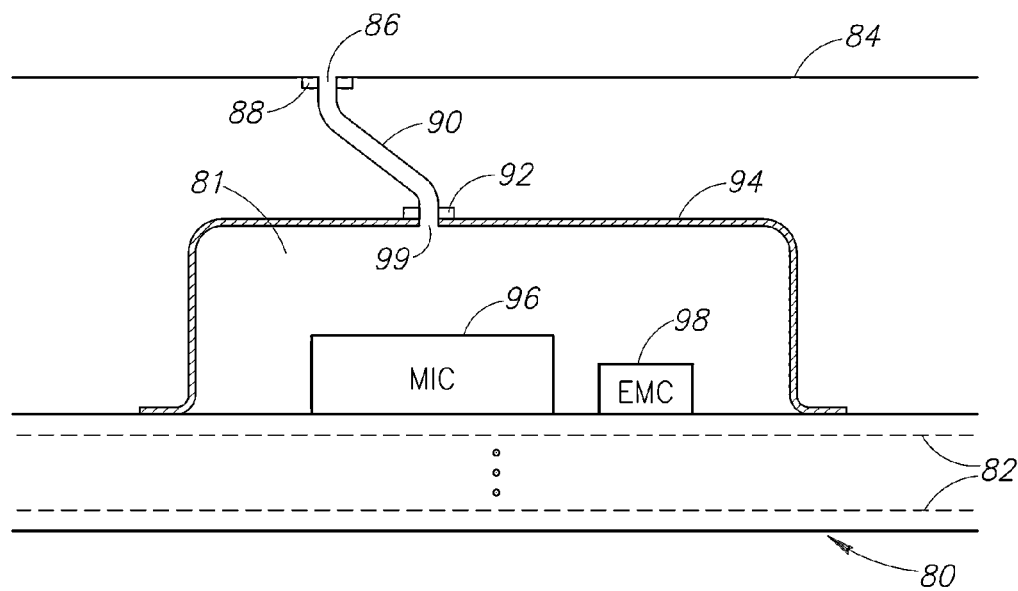
FIG. 5 is a sectional view of one embodiment of the electromagnetically shielded audio system.

A sectional view of one embodiment of the electromagnetically shielded audio system is shown in FIG. 5. The system comprises a circuit board (e.g., printed circuit board) 80 that includes two or more layers 82. A microphone 96 and EMC components 98 are mounted on the circuit board 80 (surface mounted or otherwise). A metal or metalized RF shield 94 is mechanically and electrically coupled to circuit board 80 and together with circuit board 80 forms an interior compartment 81 surrounding microphone 96 and (optionally) EMC components 98. The RF shield 94 provides EMI isolation for microphone 96 and (optionally) for EMC components 98.

RF shield 94 comprises an opening 99 which may be located in any suitable location on RF shield 94, e.g., top, sides, etc. An optional acoustic tube 90 acoustically connects the RF shield 94 with an opening (e.g. hole) 86 in housing 84 of a device, e.g. mobile wireless communications device 10. Acoustic tube 90 may be able to conduct acoustic energy from opening 86 to opening 99 and may be referred to as an acoustic coupler. The openings 99 and 86, and acoustic tube 90, may have, but need not have, circular cross-sections. Moreover, openings 99 and 86 may or may not have cross-sections that are similar to each other in size or shape or both. The path of acoustic tube 90 between openings 99 and 86 may be arbitrary, and as shown in FIG. 5, need not be a straight line. The acoustic tube 90 may be fastened and acoustically sealed to the RF shield 94 and housing 84 via one or more fastening and/or sealing rings 92, 88, respectively.

The opening 99 permits acoustic energy (which may be conveyed by sound waves) from outside the housing 84 to be channeled into compartment 81 such that compartment 81 functions as an acoustic chamber 81 for microphone 96. Once entered into acoustic chamber 81, acoustic energy (sound waves) may propagate freely throughout acoustic chamber 81. The dimensions of acoustic chamber 81 may be selected to improve the audio performance of microphone 96 and the corresponding audio system. Note that the size of opening 99 in RF shield 94 may influence the resulting audio frequency response of microphone 96.

From the point of view of RF shielding and EMC, opening 99 in RF shield 94 is preferably small, for example, in the range of 1 mm in diameter, such that RF shield 94 substantially reduces penetration of external electromagnetic fields into compartment 81. Further, acoustic tube 90 may have any suitable shape, form and profile depending on the particular implementation. In addition, there may be any number of openings in the RF shield 94, any number of openings in housing 84, and any number of acoustic tubes.

Figure 6:
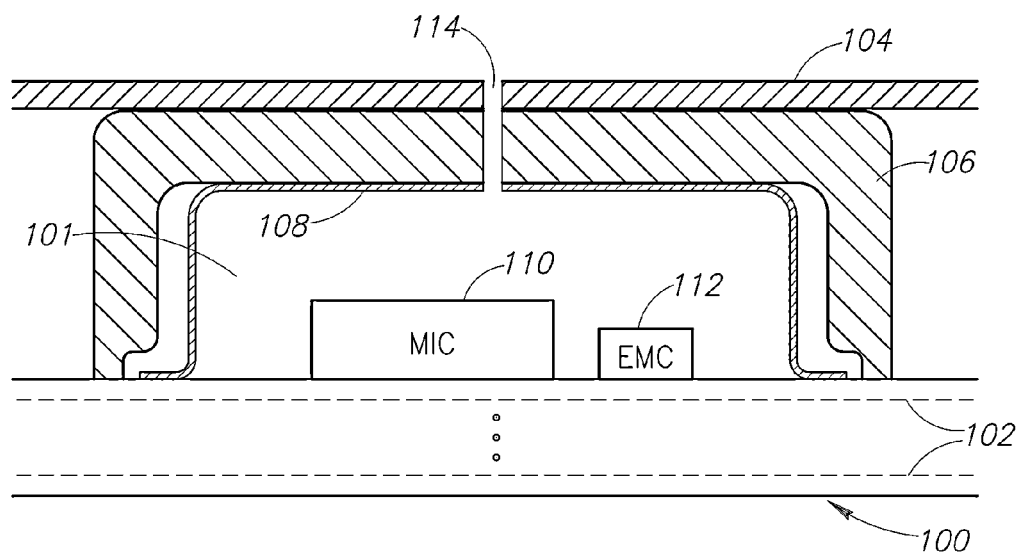
FIG. 6 is a sectional view of one embodiment of the electromagnetically shielded audio system.

A sectional view of an alternative embodiment of the electromagnetically shielded audio system is shown in FIG. 6. In this alternative embodiment, a microphone 110 and EMC components 112 are mounted onto a circuit board (e.g., printed circuit board) 100 having two or more layers 102. A metal or metalized RF shield or can 108 is placed over microphone 110 and (optionally) EMC components 112 and is mechanically and electrically coupled (e.g., soldered or using pressure) to the circuit board 100.

A flexible boot 106 made from a suitable material, such as silicon, rubber, plastic and/or other material similar thereto, is placed over the RF shield 108 thus either partially or completely encapsulating the RF shield 108. The boot 106 may serve one or more functions, such as being the material that forms a flexible acoustic tube, providing shock absorption, contributing thermal protection or improving structural stability. Housing 104 of the device is either very close to or in contact with the boot 106 and in one embodiment may provide some pressure to seal the boot 106 to the RF shield 108.

As in the system of FIG. 5, an interior compartment 101 is created within the RF shield 108 and circuit board 100 and forms an acoustic chamber 101 for the microphone 110. A channel 114 for acoustic energy passes through one or more holes made in the RF shield 108, boot 106 and housing 104. Channel 114 may be able to conduct acoustic energy from an opening in housing 104 to an opening in RF shield 108 and may be referred to as an acoustic coupler.

In an alternative embodiment, a channel (such as channels 90 and 114) can be avoided altogether where housing 104 is in direct contact with RF shield 108 and the opening in housing 104 overlaps the opening in RF shield 108. Acoustic energy may be directed from the opening in housing 104 to the opening in RF shield 108 via the overlap, which therefore effects an acoustic coupler.

It is appreciated that the two acoustic chamber arrangements 81 and 101 of FIGS. 5 and 6 are provided for illustration purposes only. One skilled in the art can implement other arrangements and configurations of the RF shield, microphone and other components to achieve the dual functionality of the RF shield to provide both RF shielding against EMI for the microphone and to form an acoustic chamber for the microphone to improve or optimize audio performance.

Dimensions of the acoustic chamber and the acoustic volume enclosed within the acoustic chamber may be selected to improve or optimize acoustical properties of the audio system in which the microphone is comprised. Dimensions of the acoustic chamber and the acoustic volume enclosed within the acoustic chamber may be selected to achieve acoustical properties of the audio system at predefined values or within a predefined range. Examples of the acoustical properties include frequency response, efficiency, signal to noise ratio, sound quality, background noise rejection, and voice intelligibility. The acoustic volume enclosed within the acoustic chamber may be defined, for example, as the volume of the acoustic chamber minus the volume of the components enclosed within the chamber. Other definitions may also be suitable. Accordingly, the size of the enclosed microphone (and optionally the EMC components) may affect the design of the acoustic chamber.

For example, the required dimensions for the acoustic chamber can be calculated and simulated in accordance with the parameters and specifications of the microphone and the requirements for the particular application, e.g., certification requirements for a cellular telephone, cordless phone, etc. The dimensions of the acoustic chamber may be determined using any suitable technique, e.g., via empirical calculations, simulations, trial and error, physical measurements, etc. Example constraints include volume, height, diameter, shape, length and diameter of the acoustic tube, etc. In one embodiment, the frequency response can be measured and one or more of the constraints modified. The frequency response is again measured and constraints adjusted. This process may continue until the desired frequency response is attained.

Achieving improved or optimal tuning of the acoustic chamber dimensions may influence the audio performance of the microphone and quality of the audio in terms of frequency response, voice intelligibility, level of background noise heard (e.g. rejection of background noise), efficiency, signal to noise ratio and sound quality. What is deemed "improved or optimal" is generally context-dependent and may involve subjective judgment, and may also vary depending upon a number of factors. Consequently, although some illustrative embodiments are described herein, the concept is not limited to those embodiments; nor is the concept limited to any particular size, shape, volume, material or any other constraints. In general, the concepts described herein can be applied in a variety of devices, having a variety of geometries and a variety of components, subject to a variety of desired audio characteristics.

In all arrangements and configurations, the metal RF shield enclosure provides the acoustic volume for improved or optimal microphone performance. The microphone in the device is physically and electrically connected to the circuit board, typically by soldering the metal or metalized RF can or shield to the printed circuit board. In one embodiment, the RF enclosure is placed over the microphone and soldered to the circuit board so as to electrically connect it to one or more layers (e.g., at least a ground layer, that is, a layer that serves as circuit ground, and which does not necessarily have any particular potential with respect to the Earth) of the circuit board.

Figure 7:
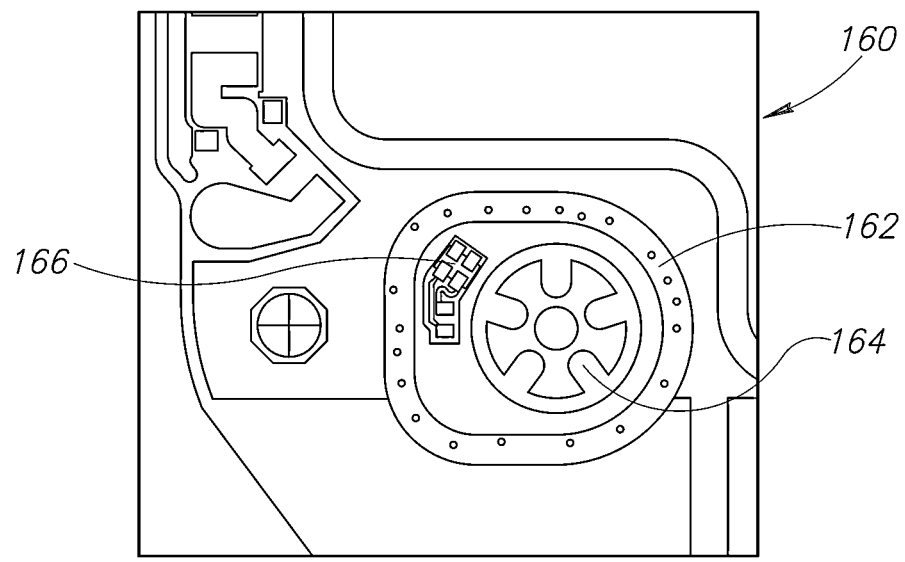
FIG. 7 is an example layer of a printed circuit board showing the microphone and surrounding RF shield wall soldering frame.
Figure 8:
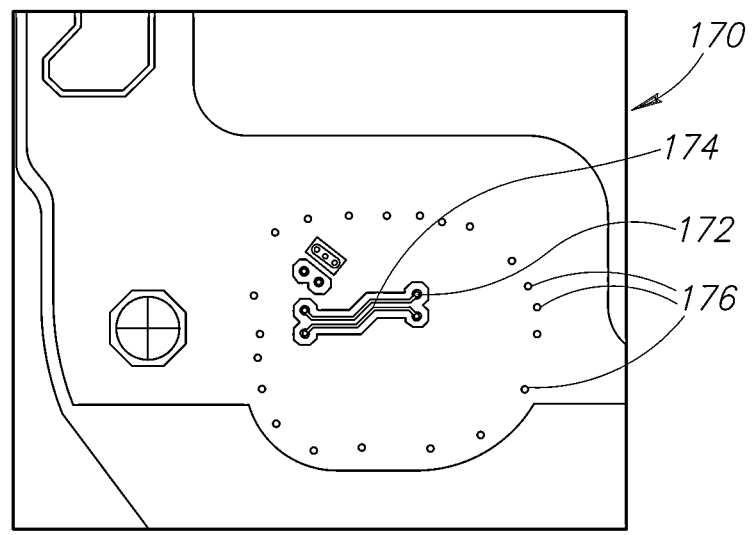
FIG. 8 is an example layer of a printed circuit board showing the RF shielding plane and balanced microphone signal lines.

In one embodiment, the circuit board comprises a multi-layer circuit board. An illustrative connection of the components is shown in FIG. 7 which illustrates the top layer 160 of an example printed circuit board layout comprising microphone mounting 164, solder frame 162 for the RF shield and EMC component mounting area 166. Underneath the soldering of the enclosure on the top surface layer is an electrical conductive connection with a copper area in deeper layers of the printed circuit board. This is shown in FIG. 8 which illustrates an inner layer 170 of the circuit board comprising a shielding plane (or layer) 172, balanced microphone signal lines 174 and shielding can vias 176 along the walls of the RF shield for contact to the ground plane. The ground plane is connected with many vias to a deeper system ground plane layer that completely covers the PCB. This provides all-around shielding for the microphone and the EMC components. Preferably, the distance between the vias is made small, e.g., less than 5 mm, to achieve high RF isolation effects against EMI.

Figure 9:
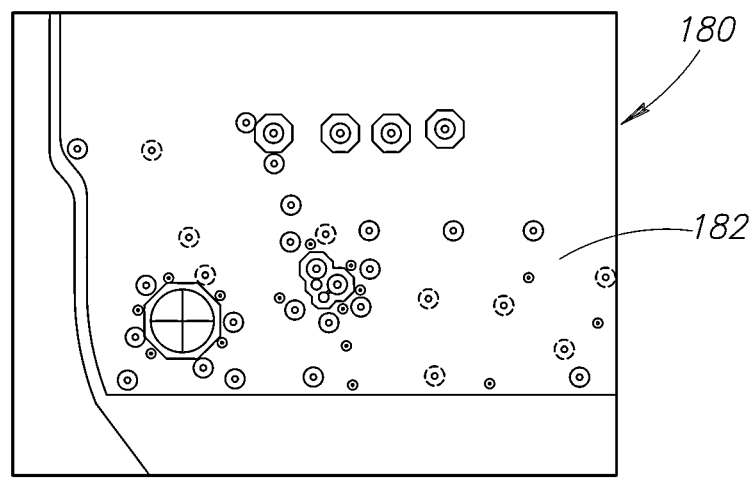
FIG. 9 is an example layer of a printed circuit board showing the RF shielding for the balanced microphone signal lines.

FIG. 9 illustrates a second circuit board layer 180 under the top layer comprising shielding 182 for the balanced microphone signal lines that lead to the microphone amplifier circuit 132 (FIG. 4).

The microphone is thus completely shielded from all sides, i.e., substantially complete shielding is provided by the combination of RF shield and one or more PCB shielding layers.

Figure 10:
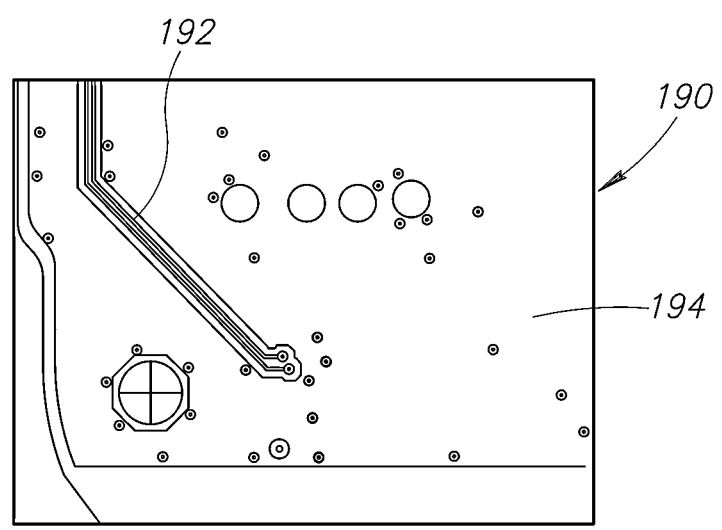
FIG. 10 is an example layer of a printed circuit board showing the left and right balanced signal lines to the microphone amplifier circuit.
Figure 11:
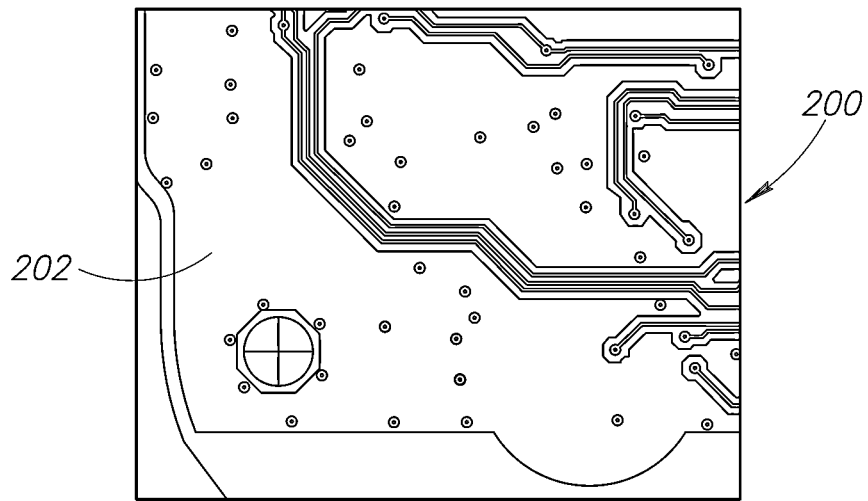
FIG. 11 is an example layer of a printed circuit board showing the RF shielding for the left and right balanced signal lines to the microphone amplifier circuit.

Optionally, the EMC components are located within the RF shield enclosure physically close to the microphone. The signal lines from the microphone pass though the EMC circuit components directly via one of the deeper layers of the multilayer PCB. They are shielded with copper traces and areas located in other layers of the PCB all along the path from the microphone to the microphone input circuit. This is shown in FIG. 10 which illustrates yet another layer 190 of the multilayer PCB comprising the balanced left and right microphone signal lines 192 to the microphone input circuit which have shielding 194 surrounding them. FIG. 11 illustrates the layer 200 that lies below the layer of FIG. 10. This layer comprises shielding 202 which provides, inter alia, a shielded channel for the balanced left and right microphone signal lines 192 (FIG. 10) to the microphone input circuit.

The microphone input circuit (amplifier circuit) portion of the circuit board will now be described in more detail. The signal lines from the microphone to the input circuit are balanced and shielded as described supra. Similar to the microphone, protection against EMI is provided for the microphone signal conditioning and amplifier circuit via an RF shield enclosing the circuit. The subsequent audio signal processing stages such as signal conditioning, converting and amplification are also enclosed by an RF shielding can with a system ground (GND) plane layer below which is located on the PCB relatively far away from the microphone shielding to reduce coupling and interference.

The signal tracks from the microphone and EMC components are routed to the audio signal processing stages in a deeper PCB layer. The signal traces are placed close together to form balanced signal tracks/lines and have system GND area on the left and right side along the microphone and audio stages to provide EMI shielding. In addition to the shielding provided on the same layer as the balanced microphone signal traces, shielding planes on top of and below the signals lines are provided which are connected using a plurality of vias to the system GND plane. This provides a complete shielding system for the microphone, the EMC components, the balanced microphone signal tracks and the microphone input circuit.

Figure 12:
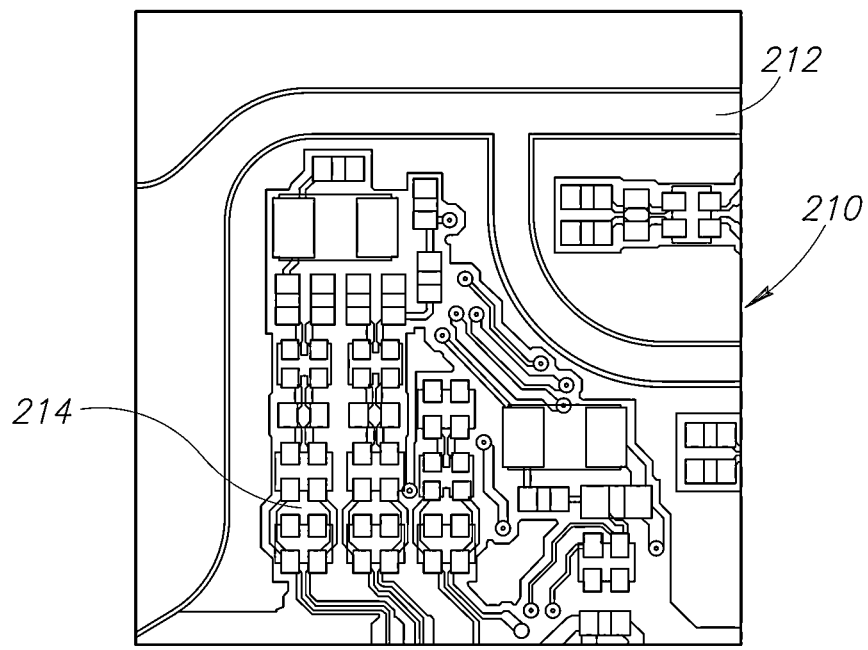
FIG. 12 is an example layer of a printed circuit board showing the RF shielding enclosure soldering frame and microphone amplifier circuit input signal path.

FIG. 12 illustrates an example layer 210 of a printed circuit board showing the RF shielding enclosure soldering frame 212 and microphone amplifier circuit input signal path 214.

Figure 13:
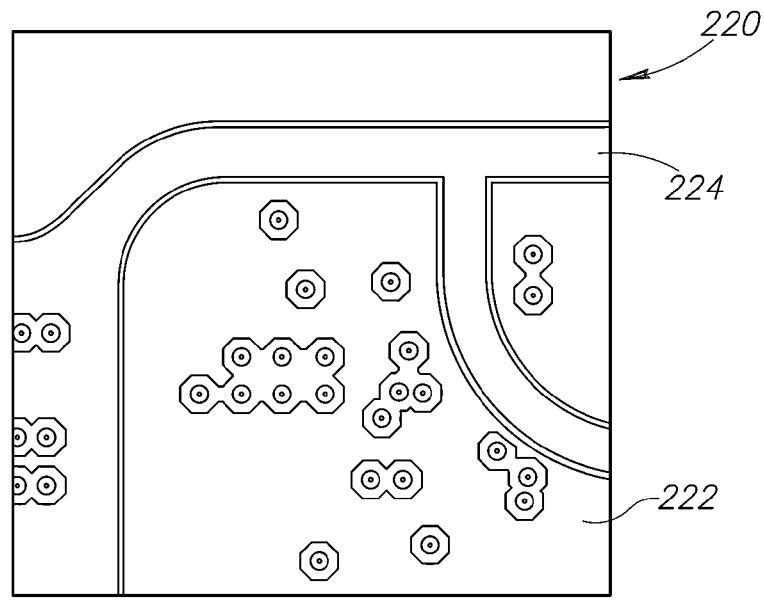
FIG. 13 is an example layer of a printed circuit board showing the RF shielding for the microphone signal path.

FIG. 13 is an example layer 220 of a printed circuit board showing the shielding wall frame ground 224 and the shielding 222 for the microphone signal path.

Figure 14:
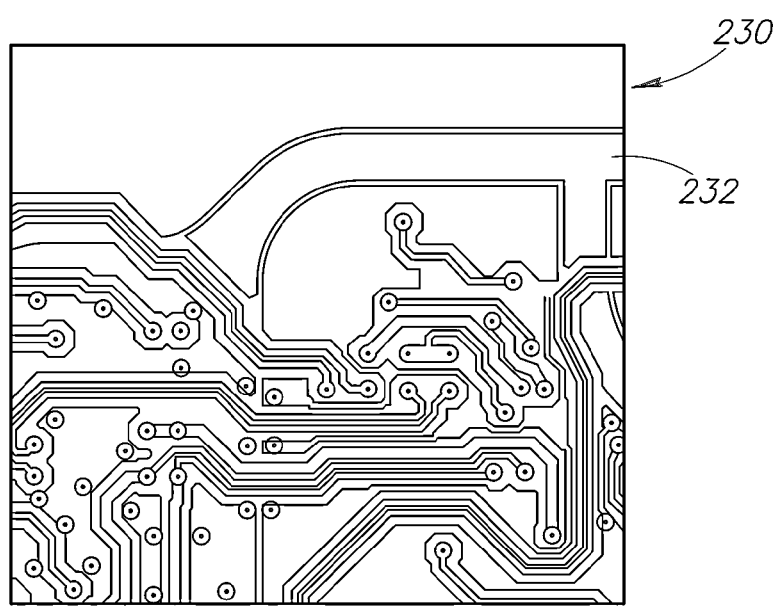
FIG. 14 is an example layer of a printed circuit board showing the right and left shielded microphone signal lines.

FIG. 14 is an example layer 230 of a printed circuit board showing the shielding for the audio shield frame ground 232. The microphone signal lines are embedded left and right in GND copper planes on the same layer. Additional GND copper planes are located in the area above and in lower PCB layers. Thus, the microphone signal lines are shielded from all four sides.

Figure 15:
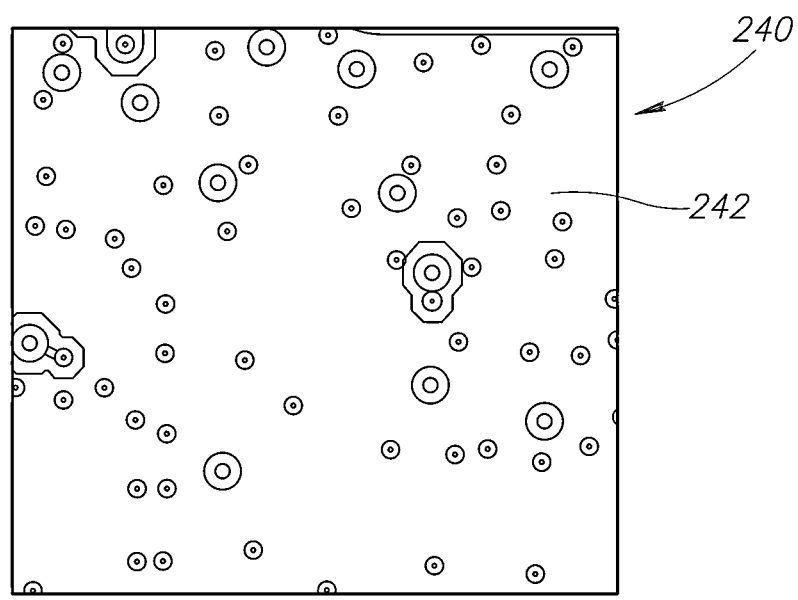
FIG. 15 is an example layer of a printed circuit board showing the ground plane for shielding the microphone signal path.

FIG. 15 is an example layer 240 of a printed circuit board showing the ground plane 242 for shielding, inter alia, the microphone signal path.

Thus, (1) the RF shielding can with the microphone and EMC components located in the can, (2) the shielded microphone balanced signal path, (3) the microphone input circuit placed at a different location on the PCB and (4) the RF shielding can with the microphone input circuit, codec and other stages located therein, combine to form a complete shielded audio system. In one embodiment, no audio lines or components are outside these mechanical enclosures which provide the required EMI isolation an improve performance of the audio system.

Using this technique, one more embodiments of the electromagnetic shielding audio system may provide benefits in a number of respects. First, the shielding can, in addition to its function as a shield, form (provide or define) an acoustic chamber together with the circuit board. The acoustic chamber may improve or optimize audio performance. Second, the electromagnetic shielding audio system may provide EMI shielding for the microphone itself. In other words, the shielding can effectively perform "double-duty," suitably serving as shielding while also providing desired audio performance. Third, the shielding may offer EMI shielding from the EMC components and the signal lines. Further additional benefits may also result, such as reduced cost, reduced parts count, space-saving, material-saving, simplified production steps and simplified device design.

The terminology used herein is for the purpose of describing particular embodiments only and is not intended to be limiting of the mechanism. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The term "operative to" refers to a capability of a physical component, i.e., if a component is "operative to" perform a function, that component is capable of performing that function.

The corresponding structures, materials, acts, and equivalents of all means or step plus function elements in the claims below are intended to include any structure, material, or act for performing the function in combination with other claimed elements as specifically claimed. The description of the mechanism has been presented for purposes of illustration and description, but is not intended to be exhaustive or limited to the mechanism in the form disclosed. As numerous modifications and changes will readily occur to those skilled in the art, it is intended that the mechanism not be limited to the limited number of embodiments described herein. Accordingly, it will be appreciated that all suitable variations, modifications and equivalents may be resorted to, falling within the spirit and scope of the mechanism. The embodiments were chosen and described in order to best explain the principles of the mechanism and the practical application, and to enable others of ordinary skill in the art to understand the mechanism for various embodiments with various modifications as are suited to the particular use contemplated.

It is intended that the appended claims cover all such features and advantages of the mechanism that fall within the spirit and scope of the mechanism. As numerous modifications and changes will readily occur to those skilled in the art, it is intended that the mechanism not be limited to the limited number of embodiments described herein. Accordingly, it will be appreciated that all suitable variations, modifications and equivalents may be resorted to, falling within the spirit and scope of the mechanism.

What is claimed is:

1. A mobile electronic device, comprising:
   a housing having an opening for entry of acoustic energy into said housing;
   radio frequency 'RF' circuitry secured inside said housing and capable of producing electromagnetic emission;
   a circuit board secured inside said housing;
   an audio system comprising a microphone mounted on said circuit board;

a radio frequency 'RF' shield that is mechanically and electrically coupled to said circuit board and surrounds said microphone, said RF shield to provide electromagnetic interference 'EMI' isolation for said microphone from at least said electromagnetic emission;

an acoustic chamber surrounding said microphone, said acoustic chamber enclosed within said RF shield and bounded by said circuit board, wherein said RF shield has an opening to permit said acoustic energy to enter said acoustic chamber and wherein said acoustic energy, after entering said acoustic chamber through said opening in said RF shield, is propagated throughout said acoustic chamber; and an acoustic coupler to conduct said acoustic energy from said opening in said housing to said opening in said RF shield, wherein dimensions of said acoustic chamber are selected to achieve acoustical properties of said audio system at defined values or within a defined range.

2. The mobile electronic device as claimed in claim 1, wherein said acoustic coupler is an acoustic tube extending from said opening in said housing to said opening in said RF shield.

3. The mobile electronic device as claimed in claim 2, wherein said acoustic tube is fastened to said RF shield using a fastening ring.

4. The mobile electronic device as claimed in claim 2, wherein said acoustic tube is fastened to said housing a fastening ring.

5. The mobile electronic device as claimed in claim 1, wherein said acoustic coupler is a channel through a boot that partially or completely encapsulates said RF shield.

6. The mobile electronic device as claimed in claim 1, wherein said housing is in direct contact with said RF shield and said acoustic coupler is effected through an overlap of said opening in said housing and said opening in said RF shield.

7. The mobile electronic device as claimed in claim 1, wherein said circuit board comprises a ground plane substantially under said RF shield for providing additional RF shielding for said microphone.

8. The mobile electronic device as claimed in claim 1, further comprising one or more electromagnetic compatibility 'EMC' components coupled to said microphone, said one or more EMC components mounted on said circuit board inside said RF shield.

9. The mobile electronic device as claimed in claim 1, wherein said acoustical properties include frequency response of said audio system.

10. The mobile electronic device as claimed in claim 1, wherein said acoustical properties include efficiency of said audio system.

11. The mobile electronic device as claimed in claim 1, wherein said acoustical properties include signal to noise ratio of said audio system.

12. The mobile electronic device as claimed in claim 1, wherein said acoustical properties include sound quality of said audio system.

13. The mobile electronic device as claimed in claim 1, wherein said acoustical properties include background noise rejection of said audio system.

14. The mobile electronic device as claimed in claim 1, wherein said acoustical properties include voice intelligibility of said audio system.

15. An electromagnetic shielded audio system, comprising:

a circuit board;

a microphone mounted on said circuit board; and a radio frequency 'RF' shield that is mechanically and electrically coupled to said circuit board and surrounds said microphone, said RF shield to provide electromagnetic interference 'EMI' isolation for said microphone; and an acoustic chamber surrounding said microphone, said acoustic chamber enclosed within said RF shield and bounded by said circuit board, wherein said RF shield has an opening to permit acoustic energy from outside of said chamber to enter said acoustic chamber and wherein said acoustic energy, after entering said acoustic chamber through said opening, is propagated throughout said acoustic chamber, and wherein dimensions of said acoustic chamber are selected to achieve acoustical properties of said audio system at defined values or within a defined range.

16. The electromagnetic shielded audio system as claimed in claim 15, further comprising an acoustic coupler to conduct acoustic energy from outside of said RF shield to said opening in said RF shield.

17. The electromagnetic shielded audio system as claimed in claim 16, further comprising a fastening ring to connect said acoustic coupler to said RF shield.

18. The electromagnetic shielded audio system as claimed in claim 15, further comprising one or more electromagnetic compatibility 'EMC' components coupled to said microphone, said one or more EMC components mounted on said circuit board inside said acoustic chamber.

19. The electromagnetic shielded audio system as claimed in claim 15, wherein said circuit board comprises a ground plane substantially under said RF shield to provide additional RF shielding of said microphone.

20. The electromagnetic shielded audio system as claimed in claim 15, wherein said acoustical properties include frequency response of said audio system.

21. The electromagnetic shielded audio system as claimed in claim 15, wherein said acoustical properties include efficiency of said audio system.

22. The electromagnetic shielded audio system as claimed in claim 15, wherein said acoustical properties include signal to noise ratio of said audio system.

23. The electromagnetic shielded audio system as claimed in claim 15, wherein said acoustical properties include sound quality of said audio system.

24. The electromagnetic shielded audio system as claimed in claim 15, wherein said acoustical properties include background noise rejection of said audio system.

25. The electromagnetic shielded audio system as claimed in claim 15, wherein said acoustical properties include voice intelligibility of said audio system.

* * * * *